(12) United States Patent
Okajima

(10) Patent No.: US 9,257,484 B2
(45) Date of Patent: Feb. 9, 2016

(54) NON-VOLATILE MEMORY DEVICE AND METHOD OF MANUFACTURING THE SAME

(71) Applicant: Kabushiki Kaisha Toshiba, Minato-ku (JP)

(72) Inventor: Mutsumi Okajima, Mie (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 0 days.

(21) Appl. No.: 13/946,502

(22) Filed: Jul. 19, 2013

(65) Prior Publication Data

US 2014/0209846 A1    Jul. 31, 2014

Related U.S. Application Data

(60) Provisional application No. 61/758,383, filed on Jan. 30, 2013.

(30) Foreign Application Priority Data

Mar. 8, 2013 (JP) .................................. 2013-046933

(51) Int. Cl.
*H01L 45/00* (2006.01)
*H01L 29/02* (2006.01)
(Continued)

(52) U.S. Cl.
CPC ........ *H01L 27/2409* (2013.01); *H01L 27/2463* (2013.01); *G11C 2213/72* (2013.01);
(Continued)

(58) Field of Classification Search
CPC ..... H01L 45/12; H01L 45/16; H01L 27/2409; H01L 27/2463; G11C 2213/77; G11C 2213/72

USPC ............................................... 257/2; 438/381
See application file for complete search history.

(56) References Cited

U.S. PATENT DOCUMENTS 6,528,841 B2 *   3/2003   Choi .................... H01L 27/115
                                                257/314
7,554,873 B2 *   6/2009   Lee ........................ G11C 13/00
                                                365/23.03

(Continued)

FOREIGN PATENT DOCUMENTS

JP          11-74523         3/1999
JP          2000-183043      6/2000

(Continued)

OTHER PUBLICATIONS

Japanese Office Action issued Dec. 8, 2015 in Japanese Patent Application No. 2013-046933, with English translation, 5 pages.

*Primary Examiner* — Julio J Maldonado
*Assistant Examiner* — Moazzam Hossain
(74) *Attorney, Agent, or Firm* — Oblon, McClelland, Maier & Neustadt, L.L.P.

(57) ABSTRACT

According to one embodiment, there are provided a memory cell forming region, a first wiring hookup region in which first wirings extending in a first direction are formed by being drawn outside of the memory cell forming region, a second wiring hookup region which is disposed in a layer above the first wirings and in which second wirings extending in a second direction are formed by being drawn outside of the memory cell forming region, and a first dummy wiring connected to each of the second wirings. The first dummy wiring is disposed so that a sum of the area of the second wiring and the area of the first dummy wiring becomes the same in the respective second wirings.

15 Claims, 15 Drawing Sheets

(51) Int. Cl.
  *H01L 29/66* (2006.01)
  *H01L 27/24* (2006.01)
(52) U.S. Cl.
  CPC ............. *G11C2213/77* (2013.01); *H01L 45/04* (2013.01); *H01L 45/06* (2013.01); *H01L 45/1233* (2013.01); *H01L 45/146* (2013.01); *H01L 45/149* (2013.01); *H01L 45/16* (2013.01); *H01L 45/1675* (2013.01)

(56) References Cited

U.S. PATENT DOCUMENTS

| | | | |
|---|---|---|---|
| 8,183,602 B2 | 5/2012 | Tabata et al. | |
| 8,384,061 B2 * | 2/2013 | Mikawa | H01L 27/101 257/2 |
| 8,461,566 B2 * | 6/2013 | Tang | H01L 21/22 257/5 |
| 2009/0134432 A1 | 5/2009 | Tabata et al. | |
| 2010/0258779 A1 * | 10/2010 | Mikawa | H01L 27/101 257/2 |
| 2011/0204309 A1 * | 8/2011 | Nitta | H01L 27/24 257/2 |
| 2011/0267867 A1 * | 11/2011 | Sakuma et al. | 365/72 |
| 2011/0291063 A1 * | 12/2011 | Kai et al. | 257/2 |
| 2012/0205612 A1 | 8/2012 | Tabata et al. | |
| 2013/0221313 A1 * | 8/2013 | Lee | H01L 45/00 257/4 |

FOREIGN PATENT DOCUMENTS

| | | |
|---|---|---|
| JP | 2006-173144 | 6/2006 |
| JP | 2008-091893 A | 4/2008 |
| JP | 2008-294434 A | 12/2008 |
| JP | 2009-130140 | 6/2009 |
| JP | 2011-243705 | 12/2011 |

* cited by examiner

NON-VOLATILE MEMORY DEVICE AND METHOD OF MANUFACTURING THE SAME

CROSS-REFERENCE TO RELATED APPLICATIONS

This application is based upon and claims the benefit of priority from U.S. Provisional Application No. 61/758,383, filed on Jan. 30, 2013 and Japanese Patent Application No. 2013-046933, filed on Mar. 8, 2013; the entire contents of all of which are incorporated herein by reference.

FIELD

Embodiments described herein relate generally to a non-volatile memory device and a method of manufacturing the same.

BACKGROUND

In recent years, a ReRAM (Resistive Random Access Memory) which stores resistance value information, for a high resistance state and a low resistance state of an electrically rewritable variable resistive element in a non-volatile manner has drawn attention as a non-volatile memory device. In a memory cell array region of the ReRAM, for example, variable resistance memory cells in which includes variable resistive elements as memory elements and rectifying elements such as diode which is connected in series to the variable resistive elements are arranged at intersection portions of a plurality of word lines extending parallel to each other in a first direction and a plurality of bit lines extending parallel to each other in a second direction perpendicular to the first direction an array shape. The word line and the bit line are extracted to a word line hookup region and a bit line hookup region, respectively, to be connected through contacts to different wiring layers.

In the word line hookup region and the bit line hookup region, contact connection portions for connecting the contacts to each of the word lines and each of the bit lines are formed so that the formation positions does not overlap between adjacent wirings. As a result, word line wiring lengths or bit line wiring lengths for matching the memory cell array region and the hookup regions are different between adjacent wirings. Therefore, in a stage of processing word lines or bit lines by using a dry etching process, a phenomenon occurs where charge-up amounts of wirings are different. Particularly, in a cross point type memory, after an upper-layer wiring is processed, a memory cell at an intersection point needs to be subsequently processed. However, in the state where the upper-layer wiring is processed, the charge-up amounts are different between the wirings. If an interlayer insulating film embedded between the memory cells is processed by dry etching in this state, there are problems in that dimensional defect occurs in the side etching of the upper-layer wiring caused by a curved trajectory of incident particles (ions, electrons) or in that falling and short-circuit of the upper-layer wiring occurs due to the side etching of the interlayer insulating film under the upper-layer wiring.

DETAILED DESCRIPTION

In general, according to an embodiment, there is provided a non-volatile memory device including a memory cell forming region, a first wiring hookup region, a second wiring hookup region, and a first dummy wiring. The memory cell forming region is a region having a memory cell array layer in which plural non-volatile memory cells are formed in a matrix shape. The first wiring hookup region is a region in which the memory cell forming region is connected to the non-volatile memory cells and in which plural first wirings extending in a first direction are formed by being drawn outside of the memory cell forming region. The second wiring hookup region is a region which is connected to the non-volatile memory cells in a layer above the first wirings in the memory cell forming region and plural second wirings extending in a second direction intersecting the first direction are formed by being drawn outside of the memory cell forming region layer. The first dummy wirings are connected to the second wirings. The first dummy wirings are provided so that a sum of the areas of the second wirings and the first dummy wirings in the memory cell forming region and the second wiring hookup region becomes the same in the respective second wirings.

Hereinafter, a non-volatile memory device and a method of manufacturing the same according to the embodiment will be described in detailed with reference to the attached drawings. The present invention is not limited to the embodiments. Cross-sectional diagrams of the non-volatile memory device used in the embodiment described hereinafter are illustrated schematically, and thus, a relationship between thickness and width of a layer, a ratio of thickness of layers, and the like may be different from actual relationships, ratios, and the like. In addition, in top diagrams of the non-volatile memory device used in the embodiment described hereinafter, hatching is used for easily identifying relationships between components. In addition, in the embodiment hereinafter, a variable resistance memory will be described as an example of a non-volatile memory device.

Figure 1A:
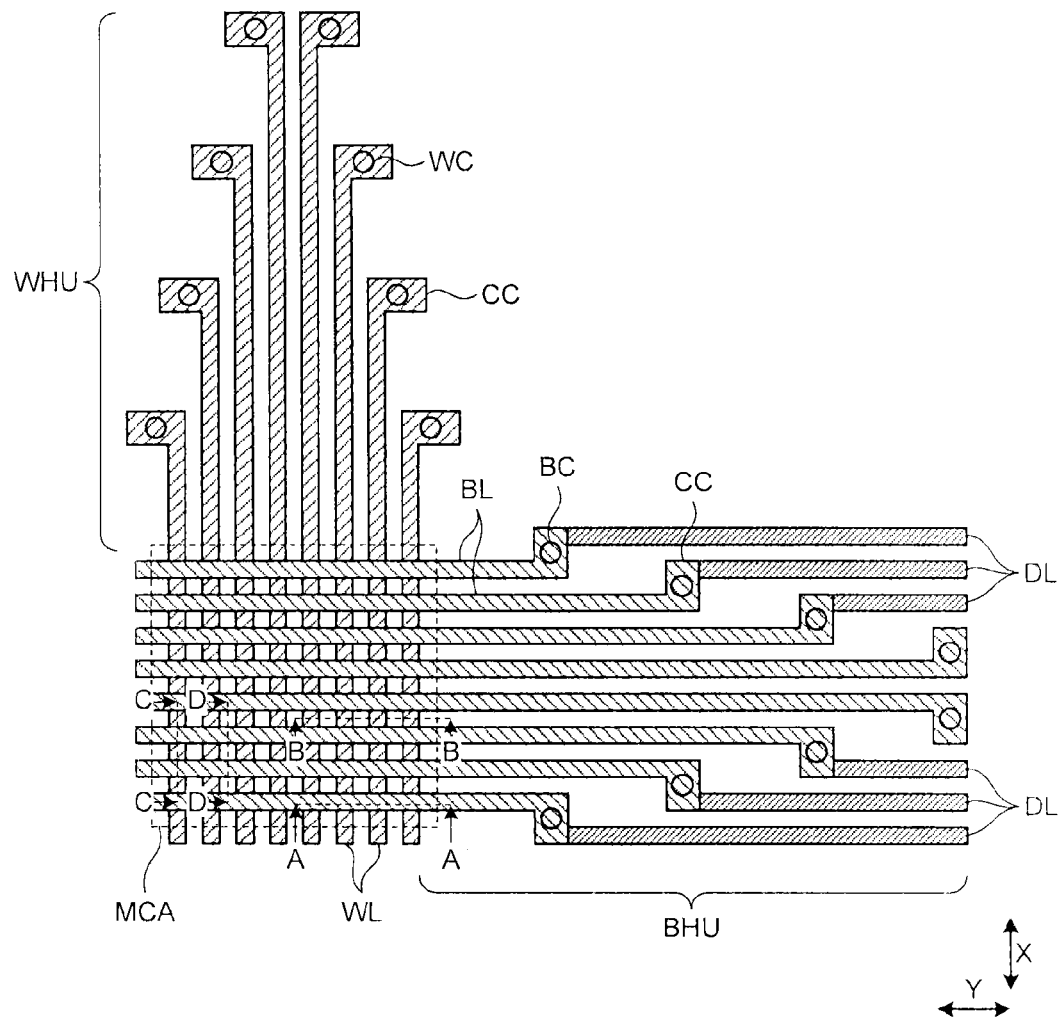
FIGS. 1A and 1B are views schematically illustrating an example of a configuration of a variable resistance memory as a non-volatile memory device according to the embodiment.
Figure 1B:
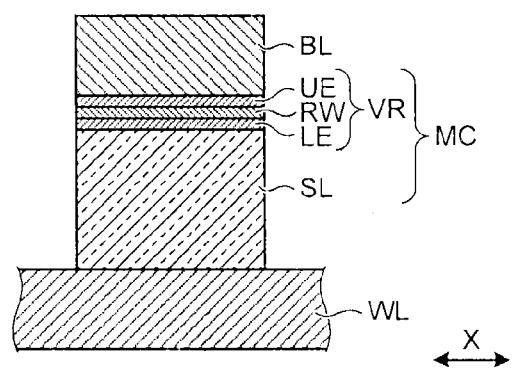
Figure 2A:
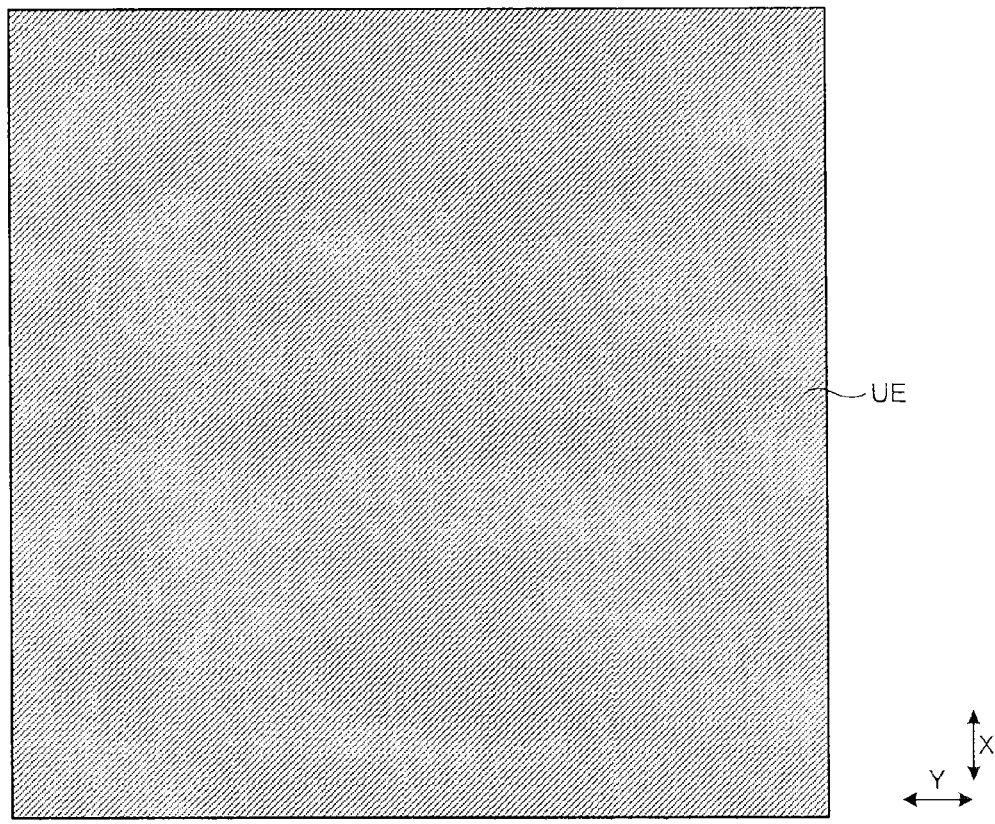
FIGS. 2A to 7E are views schematically illustrating an example of procedures of a method of manufacturing the variable resistance memory as the non-volatile memory device according to the embodiment.
Figure 2B:
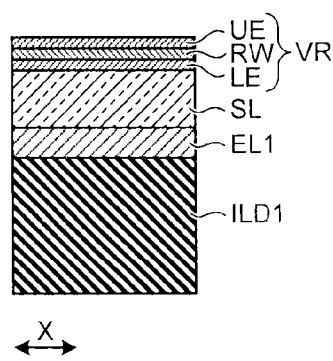
Figure 2C:
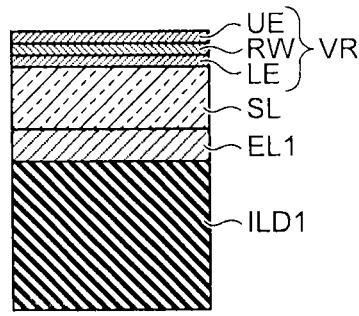
Figure 2D:
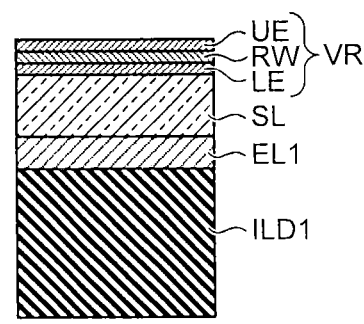
Figure 2E:
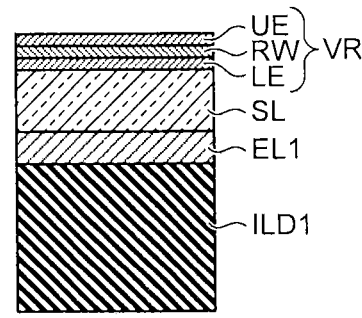

FIGS. 1A and 1B are schematic diagrams illustrating an example of a configuration of a variable resistance memory as a non-volatile memory device according to an embodiment. FIG. 1A is a top diagram illustrating the variable resistance memory according to the embodiment, and FIG. 1B is a cross-sectional diagram illustrating an example of a structure of a memory cell of the variable resistance memory. FIG. 1A illustrates wirings of a lower layer for the convenience, and FIG. 1B illustrates a cross-sectional structure on a word line along the word line.

The variable resistance memory includes a memory cell array unit MCA where, a plurality of word lines WL extending in an X direction and a plurality of bit lines BL extending in a Y direction having a height different from that of the word lines WL are arranged to intersect each other, and variable resistance memory cells (hereinafter, simply referred to as memory cells) MC where variable resistive elements VR and selector layers SL are connected in series are arranged in intersection portions of the word lines and the bit lines. In the one side of the memory cell array unit MCA in the X direction thereof, a word line hookup unit WHU is disposed so that word lines WL are extracted from the memory cell array unit MCA. In the one side of the memory cell array unit MCA in the Y direction thereof, a bit line hookup unit BHU is disposed so that the bit lines BL are extracted from the memory cell array unit MCA.

As illustrated in FIG. 1B, in the memory cell array unit MCA, a selector layer SL and a variable resistive element VR constituting a memory cell MC are stacked on the word line WL extending in the X direction, and the bit line BL extended in the Y direction is formed above the variable resistive element VR.

The selector layer SL is a layer for controlling a direction of a current flowing in the memory cell MC and is formed above the word line WL with a material having a rectification function of a Schottky barrier diode, a PN junction diode, a PIN diode, or the like. For example, the selector layer SL may be configured with a polycrystalline silicon film having a PIN junction.

The variable resistive element VR includes a lower electrode layer LE, a variable resistive layer RW as a non-volatile storage layer, and an upper electrode layer US. The lower electrode layer LE and the upper electrode layer US are configured with a metal material or a metal nitride material which does not affect variable resistance of the variable resistive layer RW in reaction with the variable resistive layer RW. As a lower electrode layer LE or an upper electrode layer UE, for example, at least one selected among metal materials of Pt, Au, Ag, Ru, Ir, Co, Al, Ti, W, Mo, Ta, and the like and a nitride of at least one selected among metal materials of Ti, W, Mo, Ta, and the like may be used. In some cases, the upper electrode layer UE or the lower electrode layer LE may not be provided.

The variable resistive layer RW is configured with a resistance change material such as a metal oxide, a carbon film, or the like of which the high resistance state and the low resistance state are switched according to a voltage value and an application time, a phase change memory material of which the resistance value is changed according to a change between crystalline and amorphous phases of a chalcogenide compound, or the like. As a resistance change material, for example, a metal oxide film including at least one or more elements among Si, Ti, Ta, Nb, Hf, Zr, W, Al, Ni, Co, Mn, Fe, Cu, Mo, and the like may be exemplified. In addition, in the case where the variable resistive layer RW is a material having a rectification characteristic, the selector layer SL may not be provided.

In the word line hookup unit WHU, the word lines WL are formed to extend from the memory cell array unit MCA. Among the word lines WL in a line-and-space shaped pattern, the lengths of the two word lines WL formed in the central portion in the Y direction are configured to longest, and the lengths of the word lines WL are configured to gradually shortened as it goes to the both ends in the Y direction. A contact connection portion CC is disposed at the end portion of each word line WL, and a word line contact WC is disposed at the contact connection portion CC. The word line contact WC is connected to a wiring of which the end portion is connected to a peripheral circuit.

In the bit line hookup unit BHU, the bit lines BL are formed to extend from the memory cell array unit MCA. Among the bit lines BL in a line-and-space shaped pattern, the lengths of the two bit lines BL formed in the central portion in the X direction are configured to longest, and the lengths of the bit lines BL are configured to gradually shortened as it goes to the both ends in the X direction. A contact connection portion CC is disposed at the end portion of each bit line BL, and a bit line contact BC is disposed at the contact connection portion CC. The bit line contact BC is connected to a wiring of which the end portion is connected to a peripheral circuit.

The adjacent memory cells MC, the adjacent word lines WL and the adjacent bit lines BL are insulated by an interlayer insulating film and the like.

In the embodiment, as illustrated in FIG. 1A, dummy wirings DL are disposed to the bit line hookup unit BHU in the bit lines BL that is a wiring layer of an upper layer so that the bit lines BL formed in the memory cell array unit MCA and to the bit line hookup unit BHU have the same area. Note that, in the example of FIG. 1A, ordinarily, since any of the bit lines BL has the same width and further the contact connection portions CC disposed to the one ends of the bit lines BL also have the same shape, the dummy wirings DL are disposed so that a total length of a bit line BL and a dummy wiring DL becomes the same in any of the bit lines BL. In the example, the dummy wirings DL are disposed to the bit lines BL other than the bit lines BL disposed to the central portion in the X-direction of the bit lines BL so that the bit lines BL other than the bit lines BL disposed to the central portion have the same length as the bit lines BL disposed to the central portion. As described above, since the lengths of the bit lines BL are longest in the vicinity of the central portion in the X-direction and become gradually shorter toward both the ends in the X-direction thereof, the lengths of the dummy wirings DL disposed on both the ends in the X-direction are longest and become gradually shorter toward the vicinity of the central portion in the X-direction.

As described later, the dummy wirings DL have such a function that when a layer between an upper layer wiring and a lower layer wiring is processed to a line and space shape, charge up amounts of respective upper layer wirings are made to the same amount.

In the variable resistance memory configured as described above, a resistance state of the variable resistive layer RW that configures the memory cell MC is changed by controlling a voltage applied to the word lines WL and the bit lines BL so that a predetermined voltage is applied to a target memory cell MC. Specifically, a reset (erase) process is executed by flowing a current to the variable resistive layer RW in a low resistance state and returning the variable resistive layer RW to a high resistance state in which a resistance is increased by one to two digits by Joule heating or a set (write) process is executed by applying a voltage to the variable resistive layer RW in the high resistance state and returning it to the low resistance state. As described above, the variable resistive layer RW is caused to function as a memory by creating the high resistance state and the low resistance state by the reset process and the set process, storing resistance value information, and detecting a difference of current flowing to the memory cell MC.

Figure 6A:
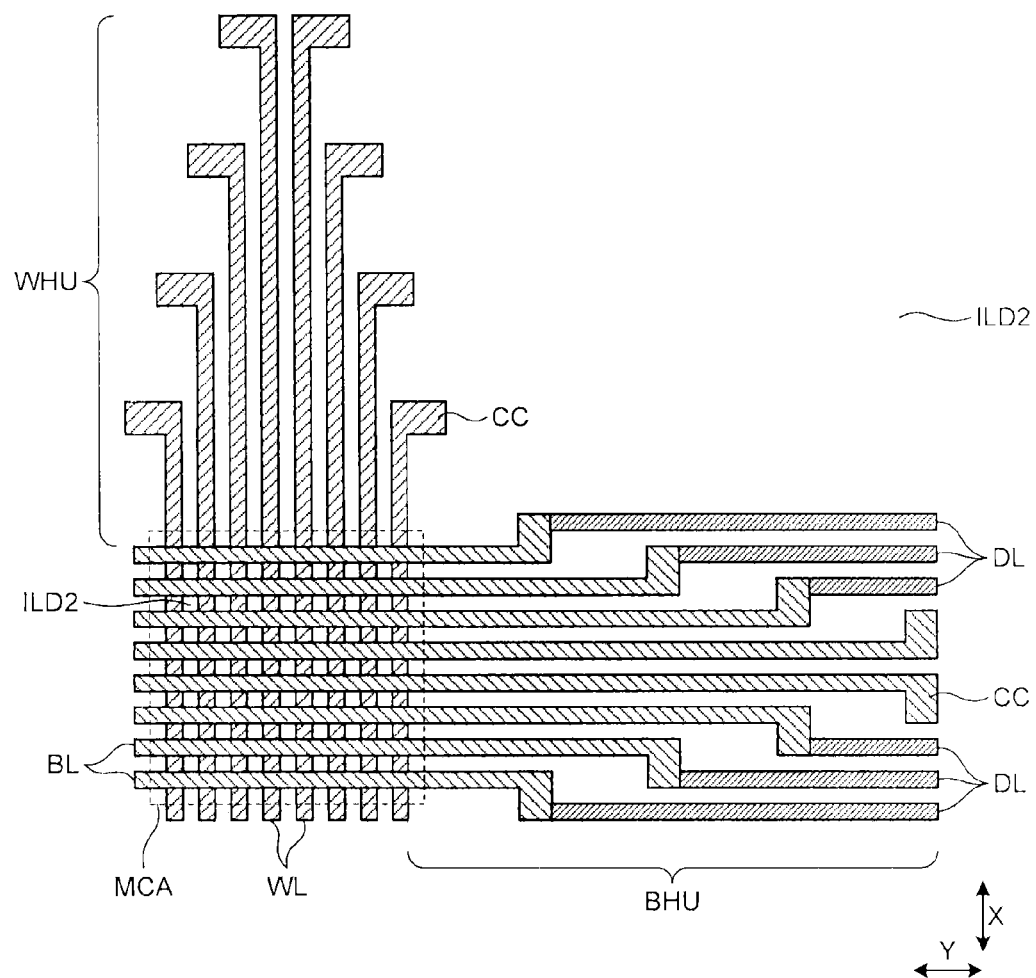
Figure 6B:
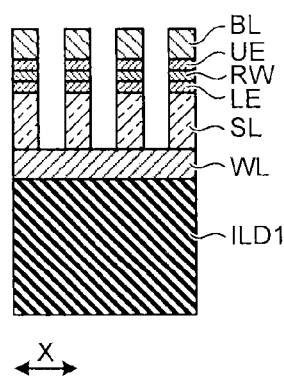
Figure 6C:
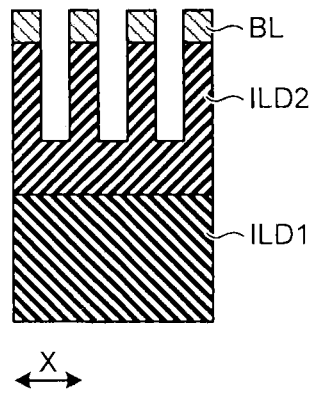
Figure 6D:
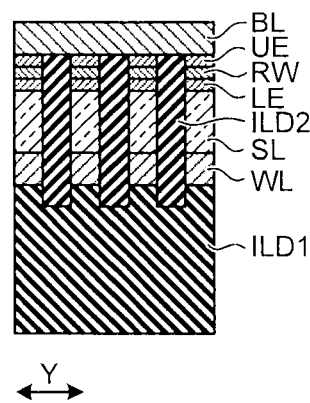
Figure 6E:
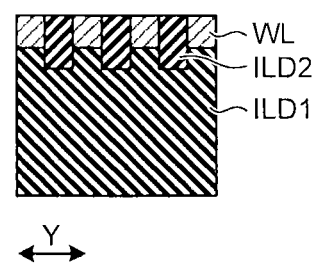
Figure 7A:
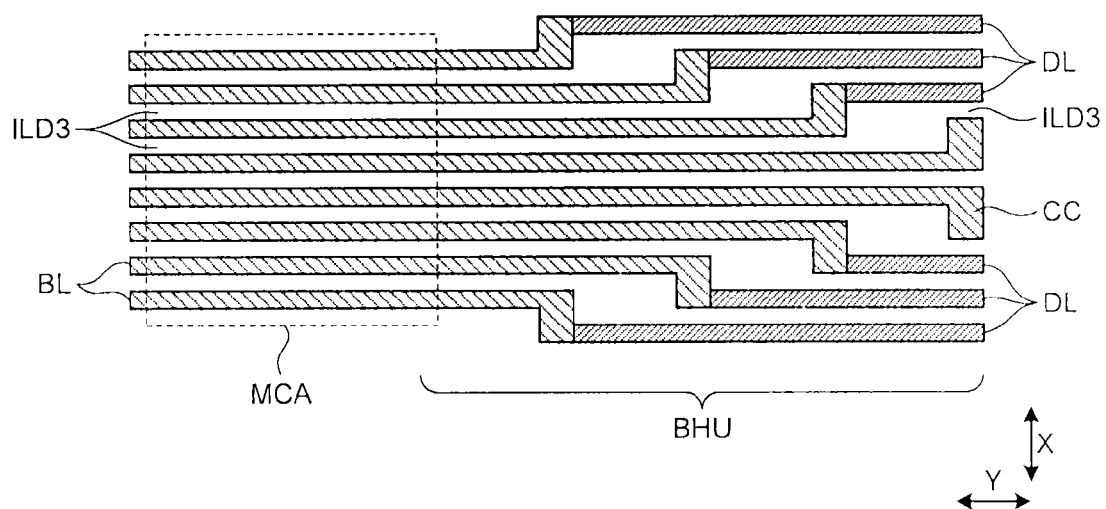
Figure 7B:
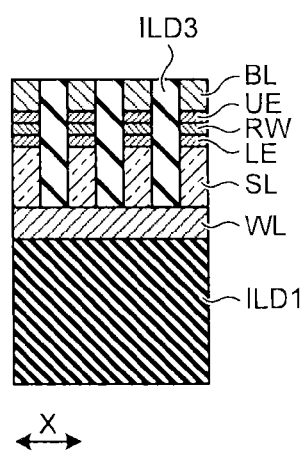
Figure 7C:
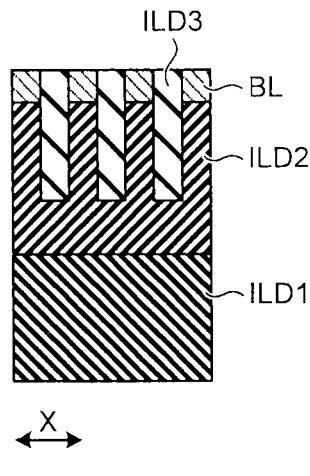
Figure 7D:
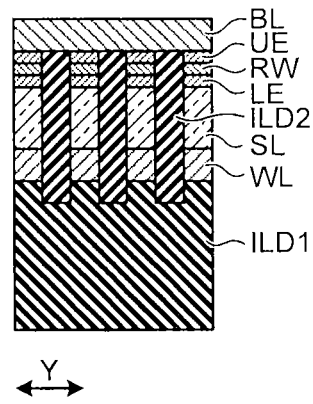
Figure 7E:
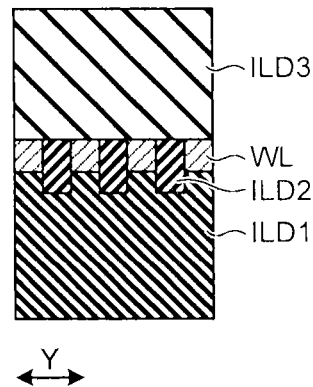

Next, a method of manufacturing the variable resistance memory configured as described will be explained. FIGS. 2A to 7E are views schematically illustrating an example of procedures of the method of manufacturing the variable resistance memory as the non-volatile memory device according to the embodiment. In the figures, FIGS. 2A to 7A are upper surface views, FIGS. 2B to 7B, which correspond to an A-A cross section of FIG. 1A, are sectional views on a word line WL along the word line WL, FIGS. 2C to 7C, which correspond to a B-B cross section of FIG. 1A, are sectional views of a portion without the word line WL along the word line WL, and FIGS. 2D to 7D, which correspond to a C-C cross section of FIG. 1A, are sectional views on a bit line BL along the bit line BL, and FIGS. 2E to 7E, which correspond to a D-D cross section of FIG. 1A, are sectional views of a portion without the bit line BL along the bit line BL. Note that, FIG. 6A illustrates wirings of a lower layer for the purpose of convenience.

First, a not illustrated peripheral circuit (Complementary Metal-Oxide-Semiconductor (CMOS) Logic circuit and the like) including an element such as a cell control transistor and the like that is connected to the word line WL, or the bit line BL of the memory cell MC and a wiring layer connected to the element is formed above a not illustrated semiconductor substrate, and an interlayer insulating film ILD1 is formed on the peripheral circuit. Subsequently, as illustrated in FIGS. 2A to 2E, a film for configuring a memory cell array layer is stacked to an overall surface on the interlayer insulating film ILD1. That is, a wiring material layer EL1, the selector layer SL, and the lower electrode layer LE, the variable resistive layer RW, and the upper electrode layer UE for configuring the variable resistive element VR are sequentially stacked.

Thereafter, as illustrated in FIGS. 3A to 3E, the upper electrode layer UE, the variable resistive layer RW, the lower electrode layer LE, the selector layer SL, and the wiring material layer EL1 are patterned in a line and space shape extending in the X-direction by dry etching such as a reactive ion etching method and the like using a word line pattern mask above the upper electrode layer UE. The etching is executed here until a bottom portion of the wiring material layer EL1 is cut off from the wiring material layer EL1 adjacent thereto in the Y-direction. With the process, the wiring material layer EL1 becomes the word lines WL, and the selector layer SL, the lower electrode layer LE, the variable resistive layer RW, and the upper electrode layer UE are formed as a pattern extending in the X-direction that is the same as that of the word lines WL.

Figure 3A:
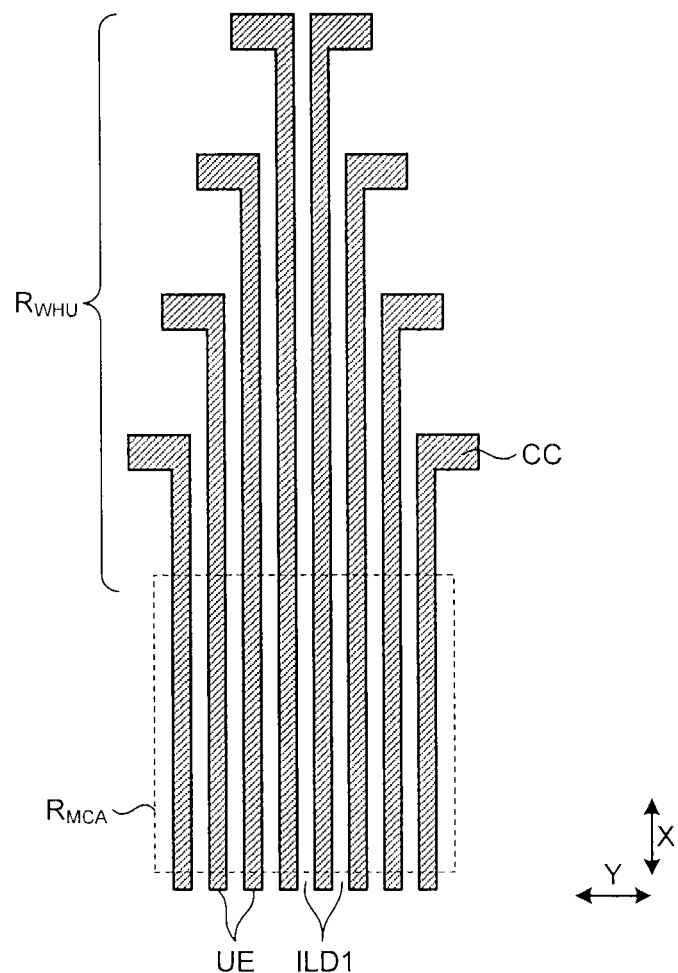
Figure 3B:
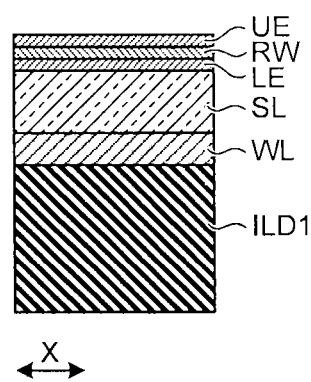
Figure 3C:
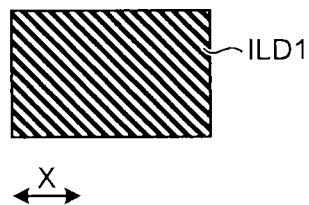
Figure 3D:
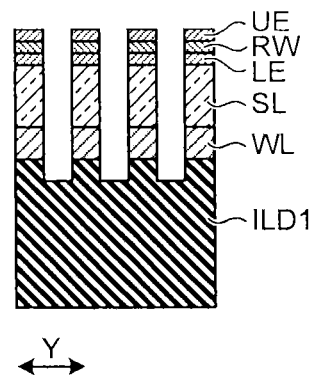
Figure 3E:
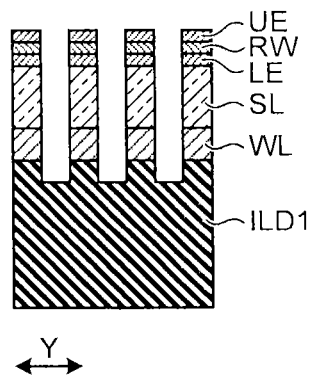
Figure 4A:
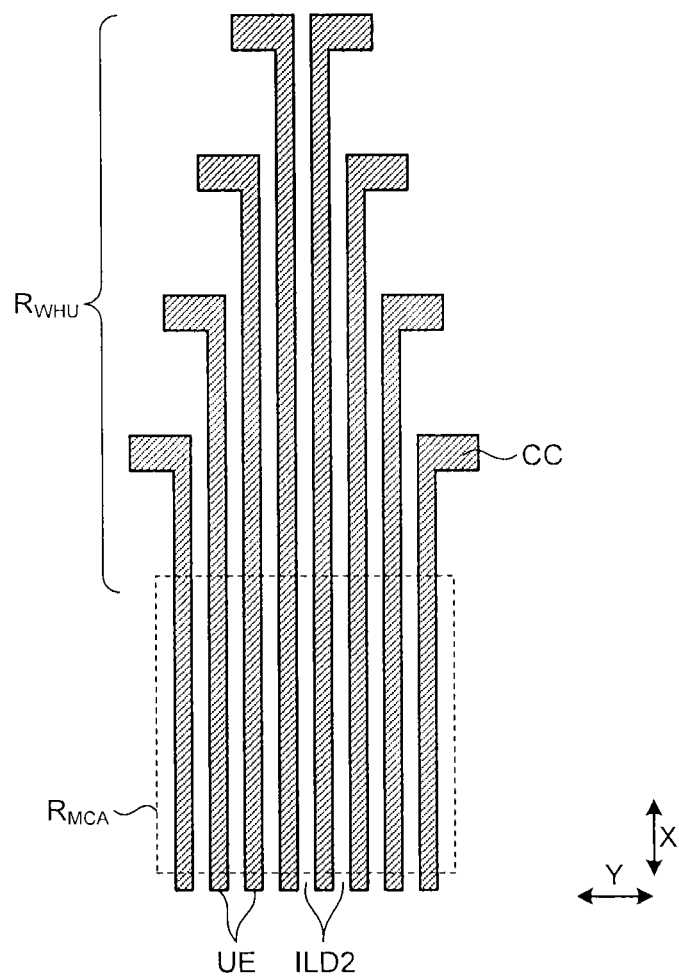
Figure 4B:
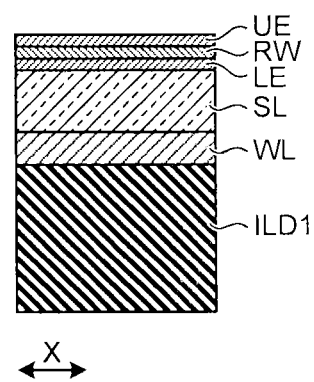
Figure 4C:
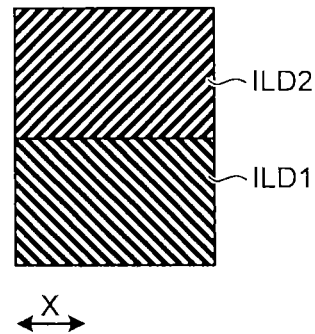
Figure 4D:
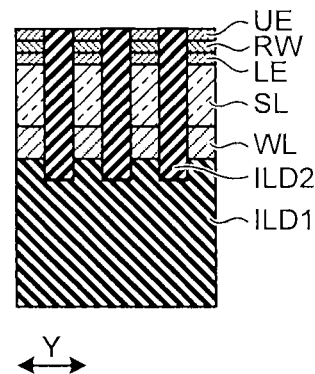
Figure 4E:
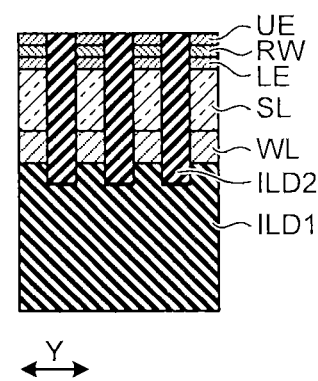
Figure 5A:
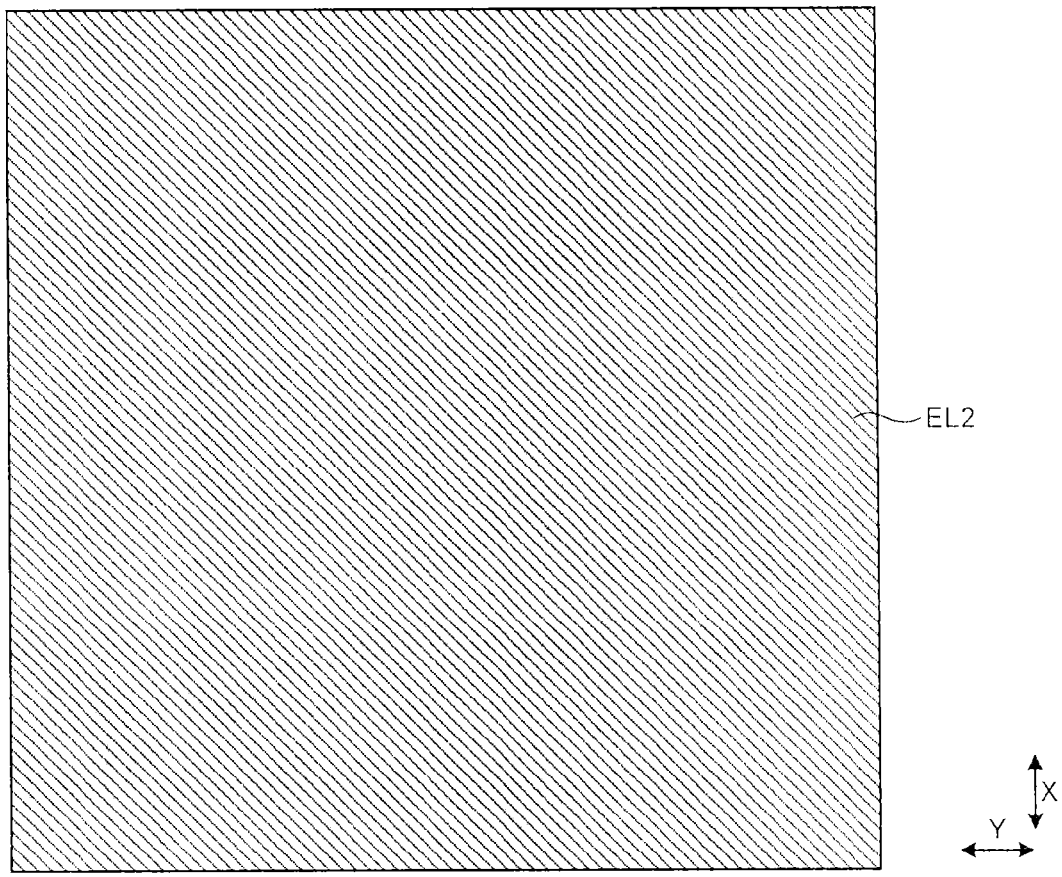
Figure 5B:
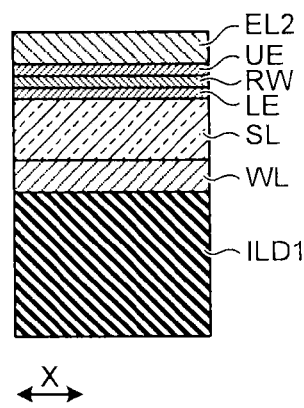
Figure 5C:
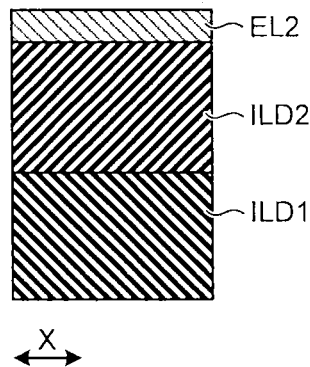
Figure 5D:
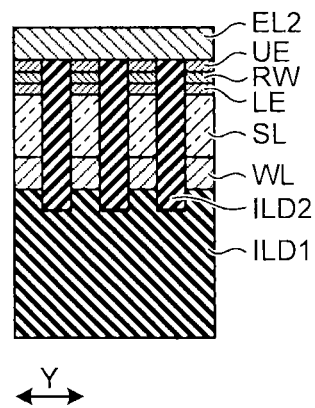
Figure 5E:
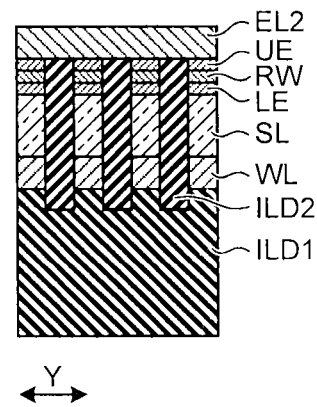

As illustrated in FIG. 3A, the word lines WL are formed throughout a memory cell array forming region $R_{MCA}$ and a word line hookup forming region $R_{WHU}$. In the word line hookup forming region $R_{WHU}$, the word lines WL are patterned so that the lengths of the word lines WL disposed in the central portion in the Y-direction are longest and the lengths of the other word lines WL become gradually shorter toward both the ends of the word line hookup forming region $R_{WHU}$ in the Y-direction. Further, in the word line hookup forming region $R_{WHU}$, each word line WL is patterned so that the contact connection portion CC, which is connected to the word line contact WC and has a width larger than a width of the word line WL, is connected to an end of the word line WL in the X-direction. With the configuration, a stacked film from the upper electrode layer UE to the wiring material layer EL1 is removed in a position other than the position where the word line WL is formed.

Note that, even if the wiring material layer EL1 is charged up while the etching is being executed, since the wiring material layer EL1 has a flat-sheet shape until it is cut off as the word line WL, charges are uniformly distributed therein. Accordingly, it is unlikely that a phenomenon that a trajectory of charged particles (ions and electrons) at the time of etching is bent by a charge charged to the wiring material layer EL1 occurs. Accordingly, in the example, the lower layer wiring (the word line WL) disposed to a lower layer of the memory cell array layer is etched by a conventional method.

Subsequently, as illustrated in FIGS. 4A to 4E, an interlayer insulating film ILD2 such as a TEOS (Tetraethoxysilane) film and the like is embedded in an etched region and an upper surface of the interlayer insulating film ILD2 is flattened while removing the interlayer insulating film ILD2 formed higher than the upper electrode layer UE by a CMP (Chemical Mechanical Polishing) method. With the process, the interlayer insulating film ILD2 is embedded between line-and-space-shaped patterns each extending in the X-direction of the memory cell array forming region $R_{MCA}$ and the word line hookup forming region $R_{WHU}$ and in a bit line hookup forming region $R_{BHU}$.

Thereafter, as illustrated in FIGS. 5A to 5E, a wiring material layer EL2 is formed on the upper electrode layer UE and on the interlayer insulating film ILD2.

Subsequently, as illustrated in FIGS. 6A to 6E, the wiring material layer EL2, a stacked film composed of the upper electrode layer UE, the variable resistive layer RW, the lower electrode layer LE, and the selector layer SL, and the interlayer insulating film ILD2 embedded between stacked films are patterned to a line and space shape extending in the Y-direction by dry etching using a bit line pattern mask. The etching is executed here until a bottom portion of the selector layer SL is cut off from the selector layer SL adjacent thereto in the X-direction. With the process, the wiring material layer EL2 of a second layer becomes a bit line BL, and a memory cell array, in which the memory cell MC which is regulated by the width of the word line WL and the width of the bit line BL and composed of a stacked film of the selector layers SL, the variable resistive element VR including the lower electrode layer LE, the variable resistive layer RW, and the upper electrode layer UE is disposed, is formed at each of the intersecting positions of the word lines WL and the bit lines BL in the memory cell array forming region $R_{MCA}$.

Further, as illustrated in FIG. 6A, the bit lines BL are formed throughout the memory cell array unit MCA and the bit line hookup unit BHU. In the bit line hookup unit BHU, the bit lines BL are patterned so that the lengths of the bit lines BL disposed in the central portion in the X-direction are longest and the lengths of the other bit lines BL become gradually shorter toward both the ends of the bit line hookup unit BHU in the X-direction. Further, in the bit line hookup unit BHU, the bit lines BL are patterned so that the contact connection portions CC, which are connected to the bit line contacts BC and have a width larger than the width of the bit lines BL are connected to the ends of the bit lines BL in the Y-direction. With the process, the wiring material layer EL2 to the selector layer SL and the interlayer insulating film ILD2 are removed at the positions other than the positions where the bit lines BL are formed.

Further, in the embodiment, patterning is executed so as to form the dummy wirings DL to the portions extending from the contact connection portions CC so that the areas of the respective bit lines BL (lengths when the widths of the respective bit lines BL are the same) becomes the same in the bit line hookup unit BHU. Here, the dummy wirings DL having a different length are disposed to the bit lines BL other than the two bit lines BL disposed in the central portion in the X-direction using the area (length) of the two bit lines BL disposed in the central portion as a reference.

As described above, when a shape of the bit lines BL that are the upper layer wirings is patterned, since the bit lines BL are processed to line-and-space-shaped bit lines BL in which the wiring material layer EL2 extends in the Y-direction at the beginning of etching, bit lines BL are charged up at the time of etching. In particular, when the respective bit lines BL have a different length, charge up amounts become different. However, since the dummy wirings DL are disposed so that the areas (lengths) of the line-and-space-shaped bit lines BL become the same in all the bit lines BL, the charge up amounts of the respective bit lines BL become approximately the same and the respective bit lines BL have approximately the same potential. That is, it is unlikely that a difference occurs in the charge up amounts between the respective bit lines BL that are patterned so that the areas (lengths) obtained by adding the areas of the respective bit lines BL and the areas of the dummy wirings DL have the same areas (lengths) by disposing the dummy wirings DL.

Further, even after the wiring material layer EL2 has been processed, the stacked film which is composed of the upper electrode layer UE, the variable resistive layer RW, the lower electrode layer LE, and the selector layer SL, and the interlayer insulating film ILD2 must be continuously processed in a line and space shape. At the time, when the charge up amounts of the wiring material layer EL2 processed as described above, that is, when the charge up amounts of the bit lines BL are different between the respective wirings, an orbit a trajectory of incident particles is bent and an abnormal dimension and the like occur when a film under the bit lines BL is processed. However, in the embodiment, since the dummy wirings DL are provided so that the areas (lengths) of the respective bit lines BL become the same, the potentials of the respective bit lines BL having been processed can be made approximately the same at the time of etching. As a result, since incident particles during dry etching are incident in a vertical direction with respect to a substrate surface, an occurrence of problem that a dimension becomes abnormal because the bit lines BL are side etched by that the trajectory of the incident particles is bent and that the bit lines BL are fallen down and short-circuited because the interlayer insulating films under the bit lines BL are side etched can be suppressed.

Thereafter, as illustrated in FIGS. 7A to 7E, an interlayer insulating film ILD3 such as a TEOS film is embedded in an etched region, the interlayer insulating film ILD3 formed higher than the bit line BL is removed by a CMP method, and an upper surface is flattened. With the process, the interlayer insulating film ILD3 is embedded between the line-and-space-shaped patterns extending in the Y-direction of the memory cell array unit MCA and the bit line hookup unit BHU and to the word line hookup units WHU.

Thereafter, through holes are formed to the interlayer insulating films ILD2, ILD3 so as to be connected to the contact connection portion CC of the word line hookup units WHU and the bit line hookup unit BHU. Subsequently, the word line contact WC and the bit line contact BC are formed in the respective regions by embedding a conductive material in the through holes. Further, the non-volatile memory device illustrated in FIGS. 1A and 1B is manufactured by forming a wiring layer connecting to the word line contact WC and to the bit line contact BC on an upper portion of the interlayer insulating film ILD3.

Note that an appropriate mask material can be used as the word line pattern mask used when the word lines WL are patterned and as the bit line pattern mask used when the bit lines BL are patterned. For example, a line-and-space-shaped resist pattern may be used as the word line pattern mask and as the bit line pattern mask. Further, after a hard mask composed of a silicon oxide film and a resist have been formed on a processing target and a line-and-space-shaped pattern has been formed in the resist, a mask formed by transferring a line-and-space-shaped pattern onto the hard mask may be used as the word line pattern mask and as the bit line pattern mask.

Further, when the interlayer insulating film ILD2 is embedded between the upper electrode layer UE and the upper layer wiring (bit line BL), a cap film composed of a conductive material that functions as a stopper film may be disposed. In the case, the cap film is formed on the upper electrode layer UE at the steps illustrated in FIGS. 2A to 2E.

Figure 8:
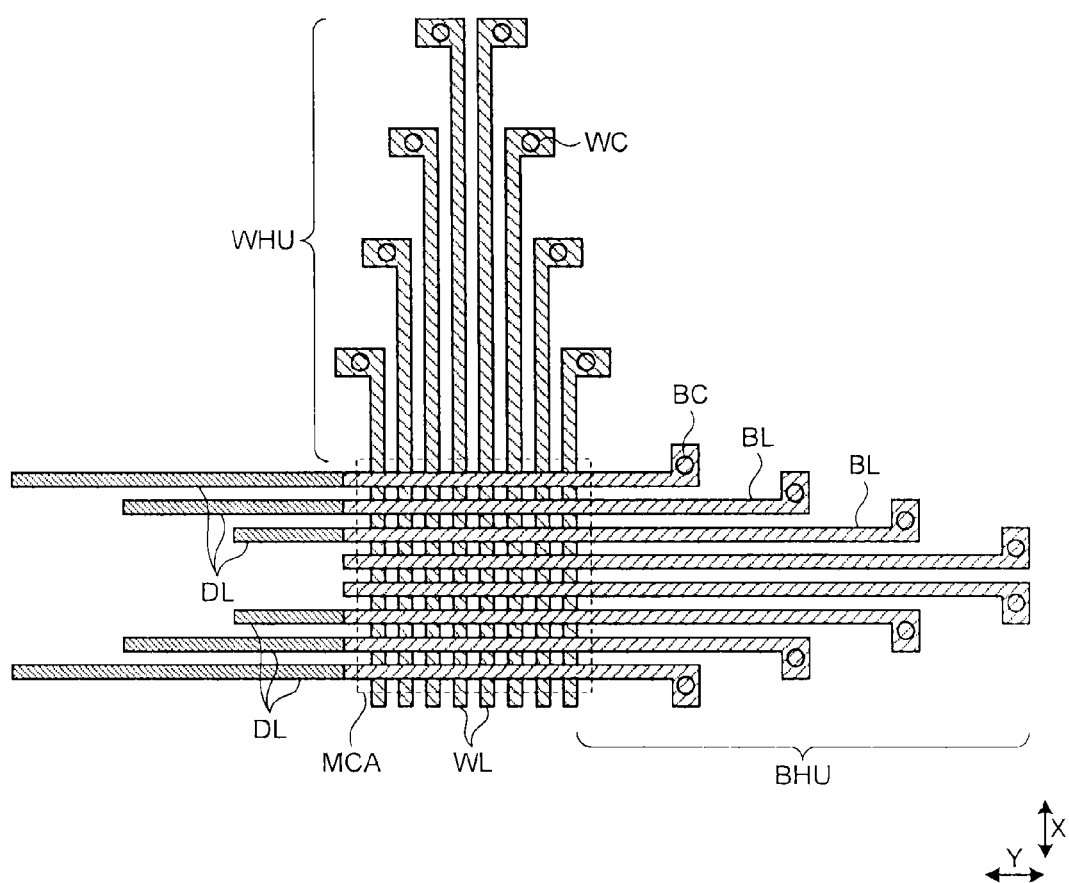
FIG. 8 is an upper surface view schematically illustrating other configuration example of the non-volatile memory device according to the embodiment.

Note that although the case that the dummy wirings DL are formed to the bit line hookup unit BHU is shown as described above, the embodiment is not limited thereto. FIG. 8 is an upper surface view schematically illustrating other configuration example of the non-volatile memory device according to the embodiment. Although FIG. 1A illustrates the case that the dummy wirings DL are disposed to the bit line hookup unit BHU, as illustrated in FIG. 8, the dummy wirings DL may be disposed to a side opposite to the bit line hookup unit BHU of the memory cell array unit MCA. Also in the case, dummy wirings DL having a different length are disposed so that the areas (lengths) of all the bit lines BL become the same.

Further, in the example described above, the width of the dummy wirings DL is made the same as the bit lines BL so that the bit lines BL have the same length, the width of the dummy wirings DL may be made different from that of the bit lines BL. In the case, the length of the dummy wirings DL is adjusted so that all the bit lines BL have the same area.

Further, the example described above shows the case that the dummy wirings DL are disposed in agreement with the area (length) of the longest bit lines BL, it is also possible to dispose the dummy wirings DL in agreement with an area (long length) larger than that of the longest bit lines BL.

Furthermore, in the above explanation, although the case that the variable resistance memory is composed of one memory cell array layer is exemplified, the embodiment can be also applied to a three-dimensional cross point type memory in which plural memory cell array layers are stacked as well as bit lines BL or word lines WL are shared between memory cell array layers that are adjacent in a stacking direction. In the case, a dummy wiring DL is disposed to a wiring that becomes a bit line BL or a word line WL of a layer other than a lowermost layer.

In a manufacturing method of the case, after, for example, FIGS. 4A to 4E, a wiring material layer, the selector layer, a lower electrode layer, a variable resistive layer, and an upper electrode layer of a second layer are sequentially stacked on the upper electrode layer UE and on the interlayer insulating film ILD2, patterning is executed from the upper electrode layer of the second layer to the selector layer SL of a first layer to a line and space shape that extends in a direction turned 90° in a substrate surface with respect to a direction in which a just-under wiring extends, and an interlayer insulating film is embedded in a patterned region. A non-volatile memory device in which an optional number of layers are stacked can be manufactured by repeating the process described above from the processes illustrated in FIGS. 2A to 2E a predetermined number of times.

Figure 9:
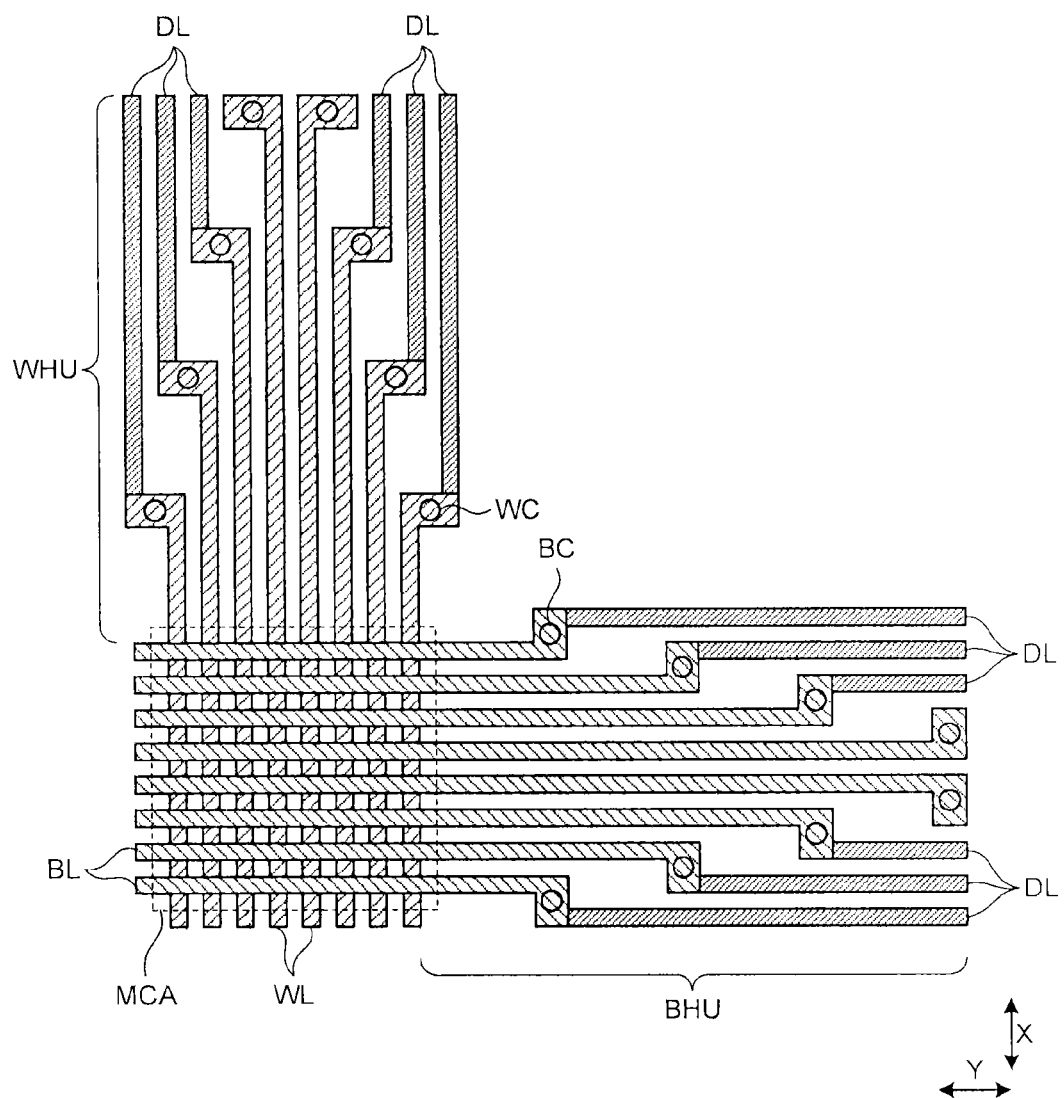
FIG. 9 is an upper surface view schematically illustrating other configuration example of the non-volatile memory device according to the embodiment.

FIG. 9 is an upper surface view schematically illustrating other configuration example of the non-volatile memory device according to the embodiment. The figure illustrates how lower layer wirings (for example, word lines WL) and upper layer wirings (for example, bit lines BL) of a memory cell array layer other than a memory cell array layer of a lowermost layer are patterned in a non-volatile memory device in which plural memory cell array layers are stacked. As illustrated in the figure, dummy wirings DL are disposed so as to be connected not only to bit lines BL as upper layer wirings but also to word lines WL as lower layer wirings. Further, a memory cell array layer of a lowermost layer of a non-volatile memory device may be provided with the structure.

In the embodiment, when layers between the upper layer wirings and the lower layer wirings are dry etched together with the upper layer wirings to a line and space shape, dummy wirings DL connected to the line-and-space-shaped upper layer wirings are disposed, and patterning is executed so that a sum of the area of the bit lines BL and the area of the dummy wirings DL of respective line patterns becomes approximately the same. With the process, the respective upper layer wirings have approximately the same charge up amount at the time of etching, and when the upper layer wirings are processed and further the layers between the upper layer wirings and the lower layer wirings are processed, it is unlikely that a difference occurs in the charge up amounts of the respective upper layer wirings. As a result, the embodiment has an effect that an occurrence of abnormality in processing such as an abnormal wiring shape due to the bending of a trajectory of incident particles during dry etching, and the like can be suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile memory device comprising:
   a memory cell forming region having a memory cell array layer where a plurality of non-volatile memory cells are formed in a matrix shape;
   a first wiring hookup region in which a plurality of first wirings are formed by being drawn outside of the memory cell forming region, the first wirings being connected to the non-volatile memory cell in the memory cell forming region, the first wirings extending in a first direction;
   a second wiring hookup region in which a plurality of second wirings are formed by being drawn outside of the memory cell forming region, the second wirings being connected to the non-volatile memory cell in a layer above the first wirings in the memory cell forming region, the second wirings extending in a second direction, the second direction intersecting the first direction;
   a first dummy wiring connected to the second wiring; and
   a contact connection portion that is provided at an end of the second wiring in the second wiring hookup region, the contact connection portion being wider than the second wiring in a direction that is perpendicular to a direction in which the second wiring extends, wherein
   the first dummy wiring is connected to the second wiring that has a smaller area than an area of a first reference wiring so that a sum of an area of the first dummy wiring and an area of the second wiring that has a smaller area than the area of the first reference wiring, is the same as the area of the first reference wiring, the first reference wiring being at least one of the following: the second wiring that has the largest area, or a set of the second wiring and the first dummy wiring that has the largest area,
   each of the non-volatile memory cells is arranged at each intersection portion of the first wiring and the second wiring so that each of the non-volatile memory cells is interposed, one end of the non-volatile memory cell being connected to the first wiring, the other end of the non-volatile memory cell being connected to the second wiring, and
   the first dummy wiring is connected to the second wiring via the contact connection portion.

2. The non-volatile memory device according to claim 1, wherein the first dummy wiring is disposed in the second wiring hookup region.

3. The non-volatile memory device according to claim 1, wherein the first dummy wiring is connected to an end of the second wiring opposite to the second wiring hookup region.

4. The non-volatile memory device according to claim 1, wherein
   each of the second wirings has the same width,
   the first dummy wiring has the same width as the second wiring, and
   a length of the first dummy wiring is set to the second wiring that has a shorter length than a length of the first reference wiring so that a sum of a length of the first dummy wiring and a length of the second wiring that has a shorter length than the length of the first reference wiring, is the same as the length of the first reference wiring.

5. The non-volatile memory device according to claim 4, wherein lengths of the plurality of second wirings in the second wiring hookup region are formed longest in the second wirings disposed to a central portion in the first direction of the memory cell forming region and are formed gradually shorter toward both the ends in the first direction, and
   lengths of the first dummy wirings connected to the other second wirings are determined using the length of the second wirings disposed to the central portion in the first direction of the memory cell forming region as the first reference wiring.

6. The non-volatile memory device according to claim 1 further comprising a second dummy wiring connected to the first wiring, wherein
   the second dummy wiring is connected to the first wiring that has a smaller area than an area of a second reference wiring so that a sum of an area of the second dummy wiring and an area of the first wiring that has a smaller area than the area of the second reference wiring, is the same as the area of the second reference wiring, the second reference wiring being at least one of the following: the first wiring that has the largest area, or a set of the first wiring and the second dummy wiring that has the largest area.

7. The non-volatile memory device according to claim 6, wherein the second dummy wiring is disposed in the first wiring hookup region.

8. The non-volatile memory device according to claim 6, wherein the second dummy wiring is connected to an end of the first wiring opposite to the first wiring hookup region.

9. The non-volatile memory device according to claim 6 wherein
   each of the first wirings has the same width,
   the second dummy wiring has the same width as the first wiring, and
   a length of the second dummy wiring is set to the first wiring that has a shorter length than a length of the second reference wiring so that a sum of a length of the second dummy wiring and a length of the first wiring that has a shorter length than the length of the second reference wiring, is the same as the length of the second reference wiring.

10. The non-volatile memory device according to claim 9, wherein
   lengths of the plurality of first wirings in the first wiring hookup region are formed longest in the first wirings disposed in a central portion in the second direction of the memory cell forming region and are formed gradually shorter toward both the ends in the second direction, and lengths of the second dummy wirings connected to the other first wirings are determined using the length of the first wirings connected to the central portion in the second direction of the memory cell forming region as the second reference wiring.

11. The non-volatile memory device according to claim 1, wherein a plurality of the memory cell array layers are stacked in a height direction and the first wiring or the second wiring is shared between the memory cell array layers adjacent in the height direction.

12. The non-volatile memory device according to claim 1, wherein the non-volatile memory cell comprises a selector layer and a variable resistive layer stacked sequentially, and the variable resistive layer is a metal oxide film containing at least one kind of an element selected from a group consisting of Si, Ti, Ta, Nb, Hf, Zr, W, Al, Ni, Co, Mn, Fe, Cu, Mo, a carbon film, or a chalcogenide compound.

13. The non-volatile memory device according to claim 1, wherein at least one set of the second wiring and the first dummy wiring in which the first dummy wiring does not extend on a line in which the second wiring extends is disposed in the second wiring hookup region.

14. The non-volatile memory device according to claim 6, further comprising a contact connection portion that is provided at an end of the first wiring in the first wiring hookup region, the contact connection portion being wider than the first wiring in a direction that is perpendicular to a direction in which the first wiring extends, wherein the second dummy wiring is connected to the first wiring via the contact connection portion.

15. The non-volatile memory device according to claim 14, wherein at least one set of the first wiring and the second dummy wiring in which the second dummy wiring does not extend on a line in which the first wiring extends is disposed in the first wiring hookup region.

* * * * *